United States Patent
Taylor

(10) Patent No.: US 7,087,978 B1
(45) Date of Patent: Aug. 8, 2006

(54) SEMICONDUCTOR RESISTOR WITH IMPROVED WIDTH ACCURACY

(75) Inventor: Richard F. Taylor, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/633,057

(22) Filed: Aug. 1, 2003

(51) Int. Cl.
  *H01L 29/00* (2006.01)
(52) U.S. Cl. .............. 257/536; 257/E29.326; 257/E27.001; 257/E27.047; 257/E21.004; 257/363
(58) Field of Classification Search .......... 257/350, 257/358, 359, 368, 379–381, 509, 510, 516, 257/528, 904, 536–538, 154, 363, 533, 543, 257/571, 572, 580–582, 577, 906, 355, E29.326, 257/E27.001, E27.047, E21.004
  See application file for complete search history.

(56) References Cited

U.S. PATENT DOCUMENTS

| | | | |
|---|---|---|---|
| 5,721,166 A * | 2/1998 | Huang et al. | 438/238 |
| 6,104,277 A * | 8/2000 | Iniewski et al. | 338/311 |
| 6,475,873 B1 * | 11/2002 | Kalnitsky et al. | 438/384 |
| 2002/0017678 A1 * | 2/2002 | Gonzalez et al. | 257/314 |

OTHER PUBLICATIONS

S. Wolf et al., Silicon Processing, 2000, Lattice Press, vol. 1, pp. 821, 822 and 834-837.*
Peter Van Zant, Microchip Fabrication, 2000, McGraw-Hill, pp. 514 and 515.*

* cited by examiner

*Primary Examiner*—Mary Wilczewski
*Assistant Examiner*—Monica Lewis
(74) *Attorney, Agent, or Firm*—Mark C. Pickering

(57) ABSTRACT

The accuracy of the width measurement of a semiconductor resistor is improved by modifying the gate mask of a standard MOS transistor fabrication process to form an opening between regions of polysilicon that are used as a mask when the substrate or well material is implanted to form the resistor.

13 Claims, 7 Drawing Sheets

SEMICONDUCTOR RESISTOR WITH IMPROVED WIDTH ACCURACY

DETAILED DESCRIPTION OF THE INVENTION

Figure 1A:
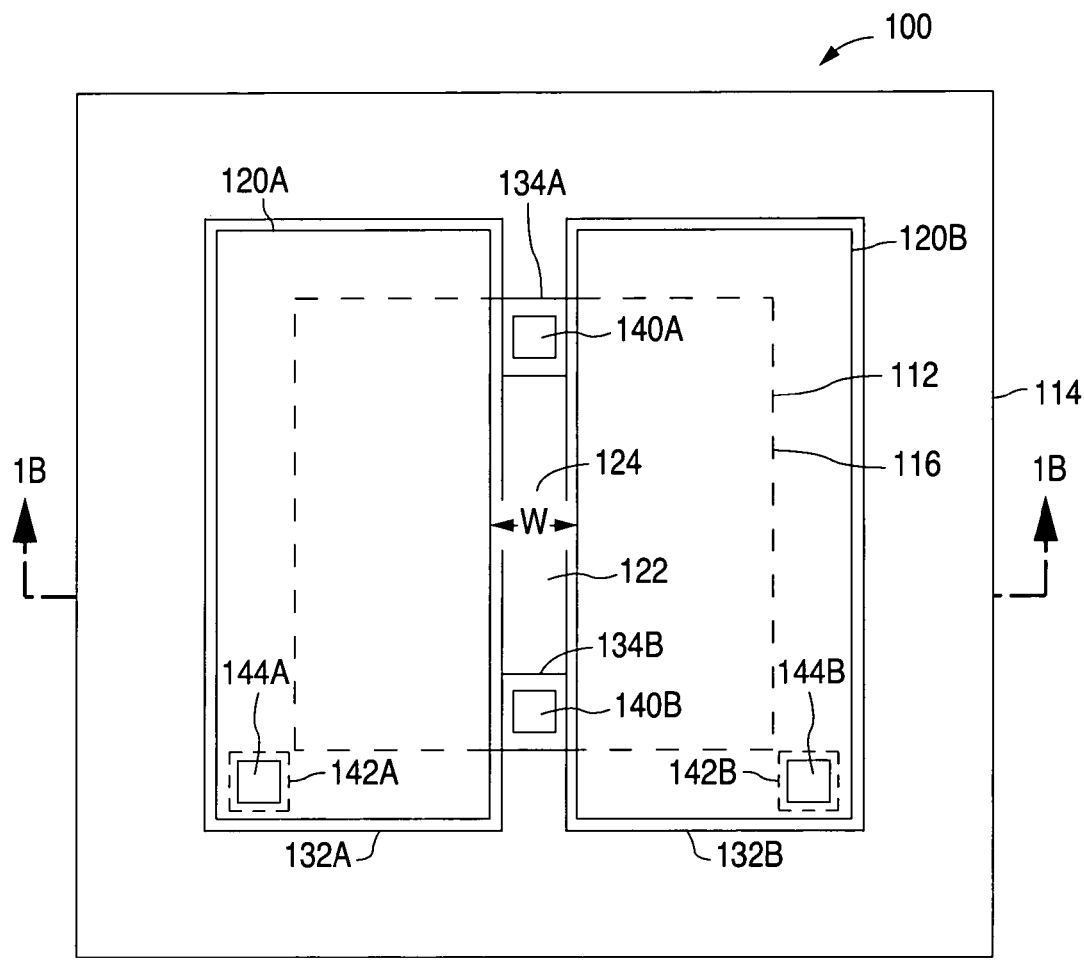
FIG. 1A is a plan view illustrating an example of a semiconductor resistor 100 in accordance with the present invention.
Figure 1B:
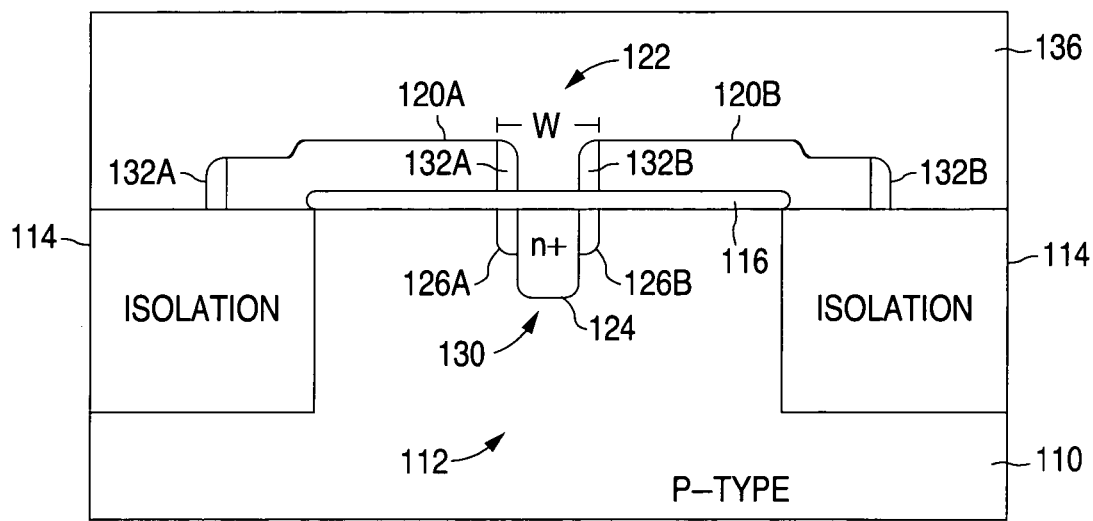
FIG. 1B is a cross-sectional view of resistor 100 taken along line 1B—1B of FIG. 1A.

FIG. 1A shows a plan view that illustrates an example of a semiconductor resistor 100 in accordance with the present invention. FIG. 1B shows a cross-sectional view of resistor 100 taken along line 1B–1B of FIG. 1A. As described in greater detail below, resistor 100 utilizes a gate mask to define the width of resistor 100 which, in turn, improves the accuracy of the width measurement of resistor 100.

As shown in FIGS. 1A–1B, resistor 100, which is formed in a p-type semiconductor material 110, such as a well, includes an active region 112 of semiconductor material 110, and an isolation region 114 that is formed in material 110 to surround active region 112 and isolate active region 112 from laterally adjacent regions.

Resistor 100 also includes a layer of gate oxide 116 that is formed on active region 112, and a pair of spaced apart polysilicon structures 120A and 120B that is formed on isolation region 114 and gate oxide layer 116 so that polysilicon structures 120A and 120B lie partially over active region 112.

In accordance with the present invention, polysilicon structures 120A and 120B define two sides, and isolation region 114 defines two sides, of a resistor opening 122. Resistor opening 122, in turn, exposes a surface area of active region 112 that lies underneath gate oxide layer 116.

In the present example, resistor opening 122 is formed to have a substantially uniform width W which, for example, can be equal to the minimum dimension that is photolithographically obtainable by a given fabrication process. (Alternately, resistor opening 122 can have other than a substantially uniform width.)

As further shown in the FIGS. 1A–1B, resistor 100 includes an n+region 124, an n– region 126A, and an n– region 126B that are formed in active region 112. In addition, n– region 126A contacts a first side of n+region 124, and n– region 126B contacts a second opposite side of n+region 124. N+ region 124, n– region 126A, and n– region 126B form a doped resistor region 130.

In addition, resistor 100 includes a side wall 132A and a side wall 132B that are formed on gate oxide layer 116. Side wall 132A contacts the side walls of polysilicon structure 120A, while side wall 132B contacts the side walls of polysilicon structure 120B. N–region 126A lies directly under a portion of side wall 132A, while n– region 126B lies directly under a portion of side wall 132B.

Further, resistor 100 includes a layer of silicide (salacide) 134A and a layer of silicide (salacide) 134B that are formed through gate oxide layer 116. Salacide layer 134A contacts the top surface of a first end region of doped resistor region 130, while salacide layer 134B contacts the top surface of a second end region of doped resistor region 130. The first and second end regions of doped resistor region 130 are the opposite ends length-wise of doped resistor region 130.

Resistor 100 additionally includes a layer of insulation material 136, and a pair of spaced apart contacts 140A and 140B. Insulation layer 136 is formed on isolation region 114, gate oxide layer 116, polysilicon regions 120A and 120B, and side walls 132A and 132B. Contacts 140A and 140B are formed through gate oxide layer 116 and insulation layer 136 to make electrical connections with salacide layers 134A and 134B, respectively. When connected to different potentials, a current flows into one of the contacts, such as contact 140A, and flows out of the other contact, such as contact 140B.

In addition, resistor 100 can include layers of silicide 142A and 142B that are formed on polysilicon structures 120A and 120B, and a pair of contacts 144A and 144B that are formed through insulation layer 136 to make electrical connections with metal silicide layers 142A and 142B, respectively.

Contacts 144A and 144B are electrically connected to semiconductor material 110 via the interconnect structure, e.g, via one or more metal traces and one or more contacts. This maintains an equal potential between contacts 144A and 144B and semiconductor material 110, thereby preventing the surface of active region 112 under polysilicon structures 120A and 120B from inadvertently inverting.

The resistance of resistor 100 is defined by, among other things, the length and width of resistor 100. The length of resistor 100 is defined by the spacing between contacts 140A and 140B. In accordance with the present invention, the width of resistor 100 is defined by the width W of resistor opening 122.

The width W of resistor opening 122 is the distance separating polysilicon structures 120A and 120B which, in turn, can be equal to the minimum feature size that is photolithographically obtainable with the fabrication process. Thus, the width of resistor 100 can be defined to be, for example, ±10% of the minimum photolithographic feature size, which improves the accuracy of the width measurement of resistor 100.

Figure 1C:
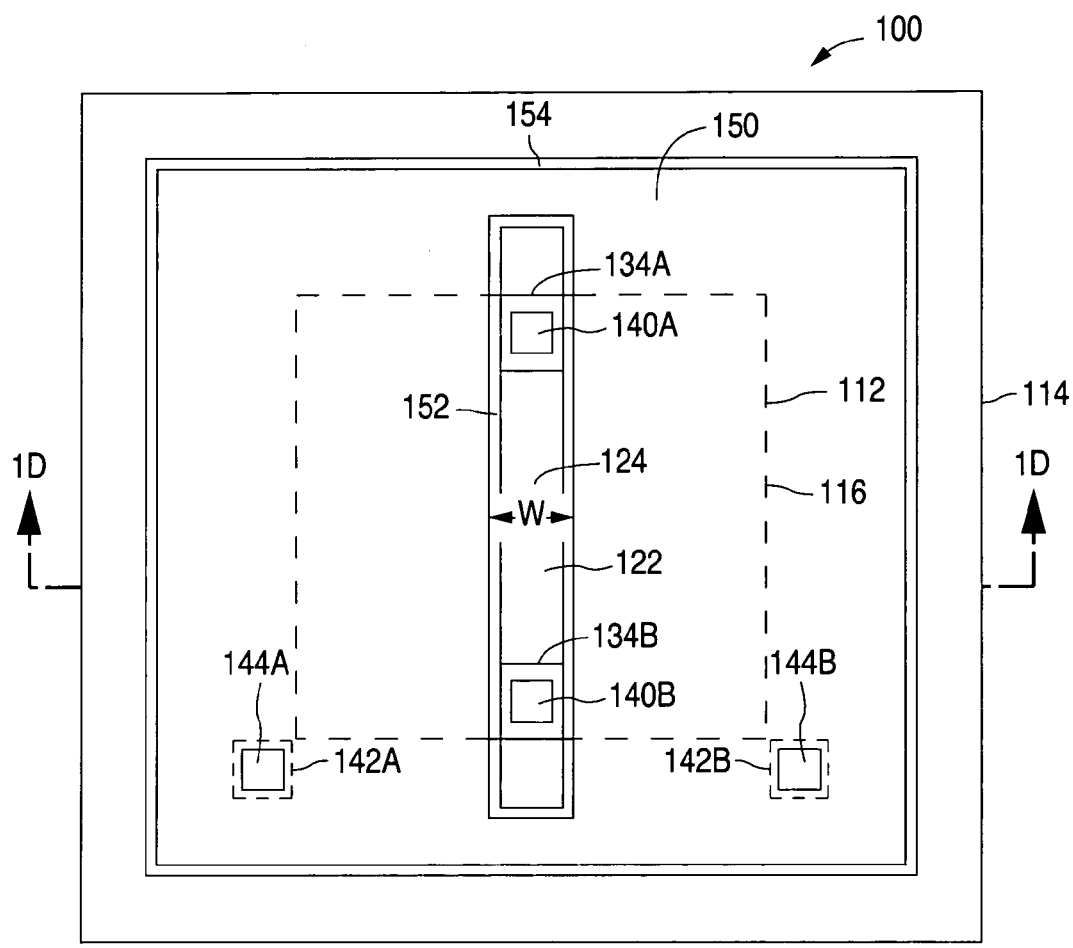
FIG. 1C is a plan view illustrating an example of an alternate embodiment of resistor 100 in accordance with the present invention.
Figure 1D:
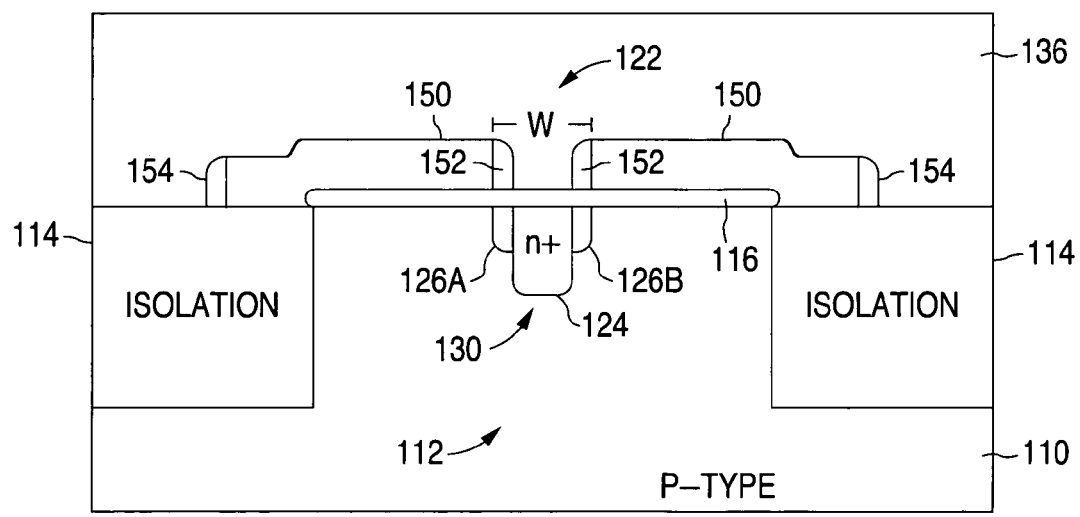
FIG. 1D is a cross-sectional view of resistor 100 taken along line 1D—1D of FIG. 1C.

FIG. 1C shows a plan view that illustrates an example of an alternate embodiment of resistor 100 in accordance with the present invention. FIG. 1D shows a cross-sectional view of resistor 100 taken along line 1D—1D of FIG. 1C. As shown in FIGS. 1C and 1D, rather than using spaced-apart polysilicon structures 120A and 120B, a single polysilicon structure 150 that has an enclosed opening that defines resistor opening 122 can alternately be used.

In addition, a side wall 152 and a side wall 154 are formed on gate oxide layer 116. Side wall 152 contacts the inner side walls of polysilicon structure 150, and side wall 154 contacts the outer side walls of polysilicon structure 150. (Resistor opening 122 can alternately be smaller so that only active region 112 is exposed.)

Figure 2A:
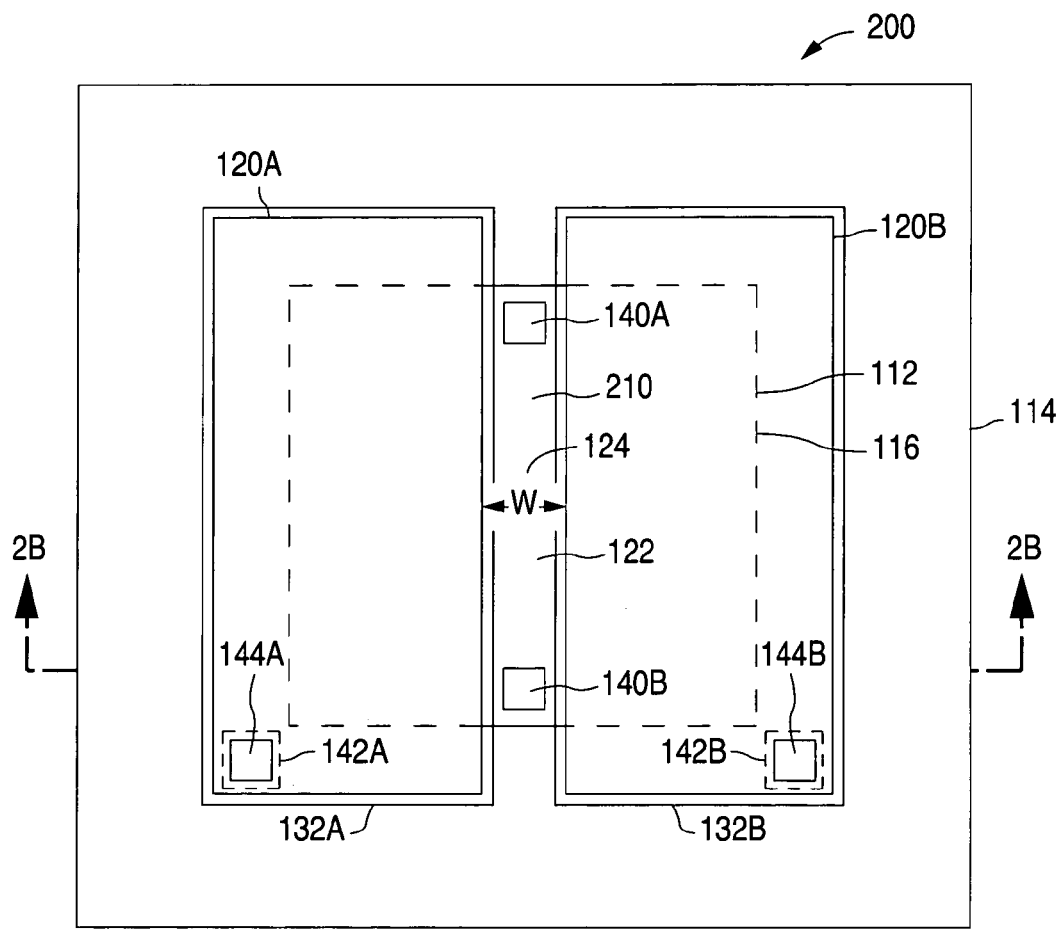
FIG. 2A is a plan view illustrating an example of a semiconductor resistor 200 in accordance with an alternate embodiment of the present invention.
Figure 2B:
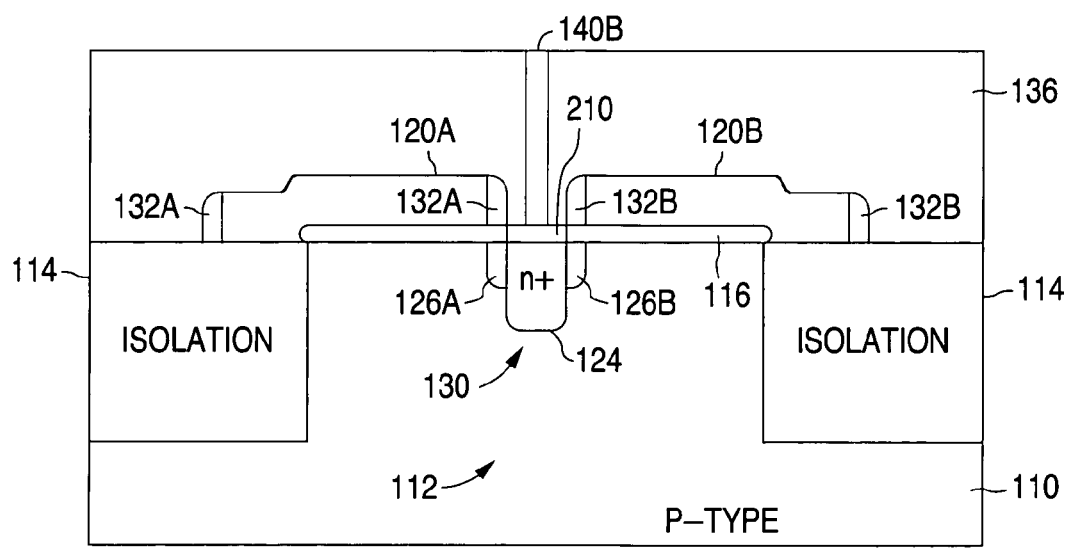
FIG. 2B is a cross-sectional view of resistor 200 taken along line 2B—2B of FIG. 2A.

FIG. 2A shows a plan view that illustrates an example of a semiconductor resistor 200 in accordance with an alternate embodiment of the present invention. FIG. 2B shows a cross-sectional view of resistor 200 taken along line 2B—2B of FIG. 2A. Resistor 200 is similar to resistor 100 and, as a result, utilizes the same reference numerals to designate the structures which are common to both resistors.

As shown in FIGS. 2A–2B, resistor 200 differs from resistor 100 in that resistor 200 includes a single metal silicide (salacide) layer 210 that is formed on the surface of n+ region 124 in lieu of spaced apart layers 134A and 134B. Contacts 140A and 140B, in turn, are formed on metal silicide layer 210 to make electrical connections with metal silicide layer 210. Resistor 200 has lower resistivity than resistor 100.

Figure 2C:
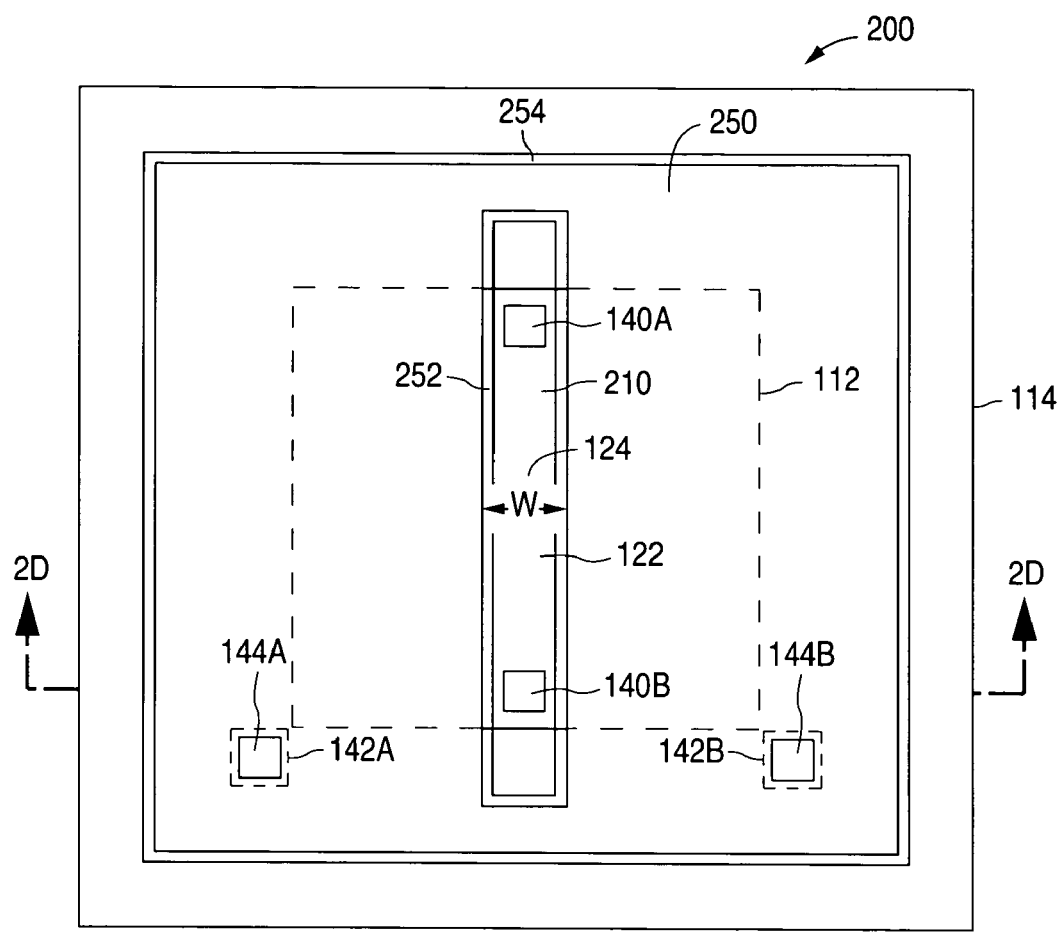
FIG. 2C is a plan view illustrating an example of an alternate embodiment of resistor 200 in accordance with the present invention.
Figure 2D:
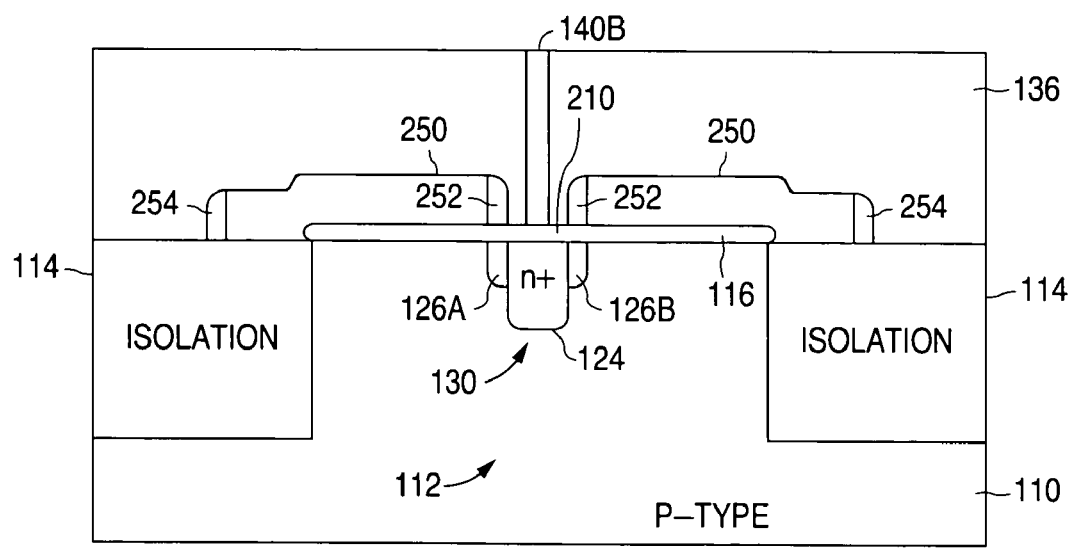
FIG. 2D is a cross-sectional view of resistor 200 taken along line 2D—2D of FIG. 2C.

FIG. 2C shows a plan view that illustrates an example of an alternate embodiment of resistor 200 in accordance with the present invention. FIG. 2D shows a cross-sectional view of resistor 200 taken along line 2D—2D of FIG. 2C. As shown in FIGS. 2C and 2D, rather than using spaced-apart polysilicon structures 120A and 120B, a single polysilicon structure 250 that has an enclosed opening that defines resistor opening 122 can alternately be used. In addition, a side wall 252 and a side wall 254 are formed on gate oxide layer 116. Side wall 252 contacts the inner side walls of polysilicon structure 250, and side wall 254 contacts the outer side walls of polysilicon structure 250.

Figure 3A:
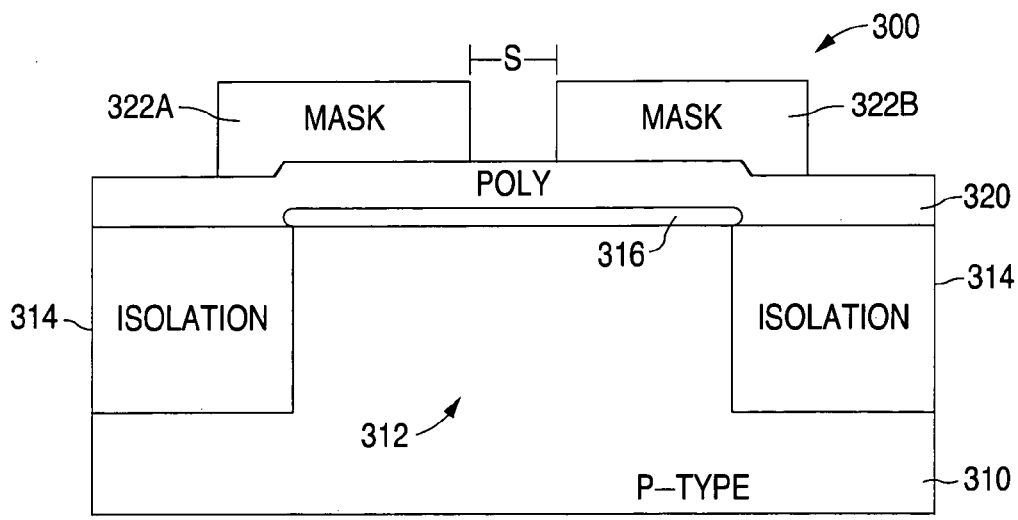
FIGS. 3A–3E are cross-sectional diagrams illustrating an example of a method 300 of forming a resistor in accordance with the present invention.

FIGS. 3A–3E show cross-sectional diagrams that illustrate an example of a method 300 of forming a resistor in accordance with the present invention. As shown in FIG. 3A, method 300 utilizes a conventionally formed semiconductor structure. The semiconductor structure, which is formed in a p-type semiconductor material 310, such as a well, includes an active region 312 of semiconductor material 310, and an isolation region 314 that is formed in material 310 to surround active region 312 and isolate active region 312 from laterally adjacent regions.

As further shown in FIG. 3A, method 300 begins by forming a layer of gate oxide 316 on active region 312. After gate oxide layer 316 has been formed, a layer of polysilicon (poly) 320 is formed on isolation region 314 and oxide layer 316. Once poly layer 320 has been formed, a pair of gate masks 322A and 322B is formed and patterned on poly layer 320.

In the present example, gate masks 322A and 322B are spaced apart and have a substantially uniform separation S which, for example, can be equal to the minimum dimension that is photolithographically obtainable by a fabrication process. (Alternately, gate masks 322A and 322B can have other than a substantially uniform separation between each other. In addition, gate masks 322A and 322B can be formed as a single mask that has an enclosed opening with width S.)

Figure 3B:
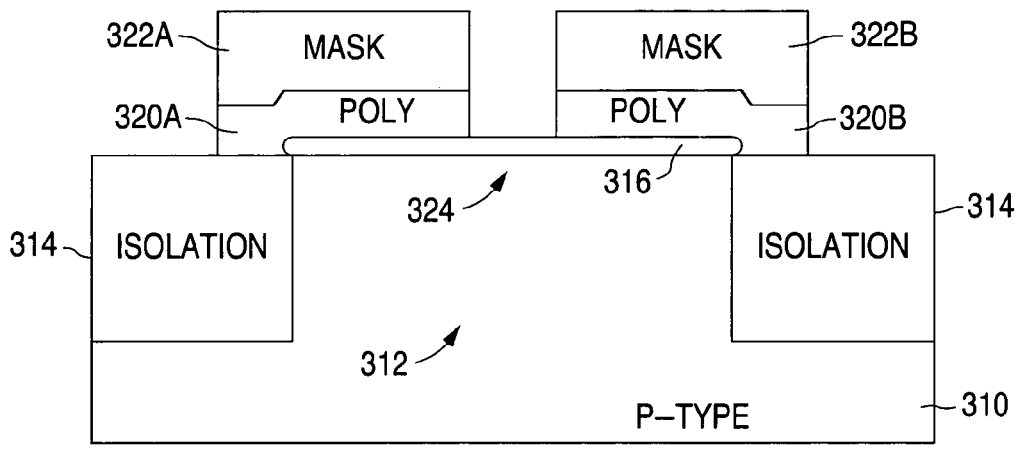

As shown in FIG. 3B, after gate masks 322A and 322B have been formed, the exposed regions of poly layer 320 are etched to form polysilicon structures 320A and 320B. Gate masks 322A and 322B are then removed. Polysilicon structures 320A and 320B, which are similar to polysilicon structures 120A and 120B, along with isolation region 314, define a first resistor region 324 on the surface of active region 312.

Figure 4:
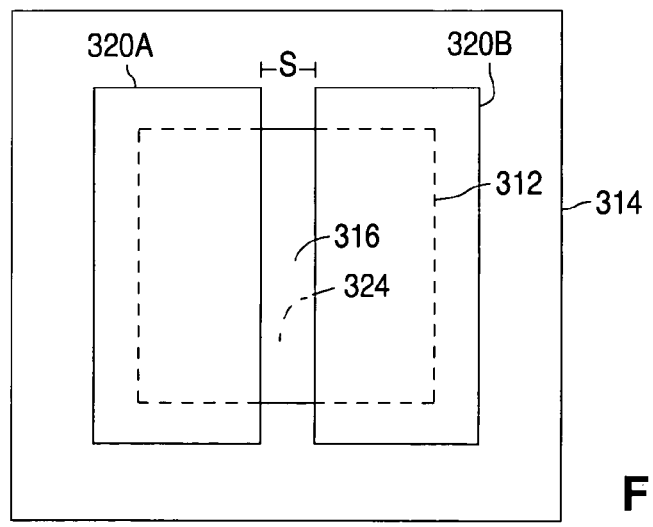
FIG. 4 is a plan view illustrating an example of a semiconductor device that results following the etch of polysilicon layer 320 and the removal of gate masks 322A and 322B in accordance with the present invention.

FIG. 4 shows a plan view that illustrates an example of a semiconductor device that results following the etch of polysilicon layer 320 and the removal of gate masks 322A and 322B in accordance with the present invention. As shown in FIG. 4, polysilicon structures 320A and 320B along with isolation region 314 define a first resistor region 324 on the surface of active region 312.

Figure 3C:
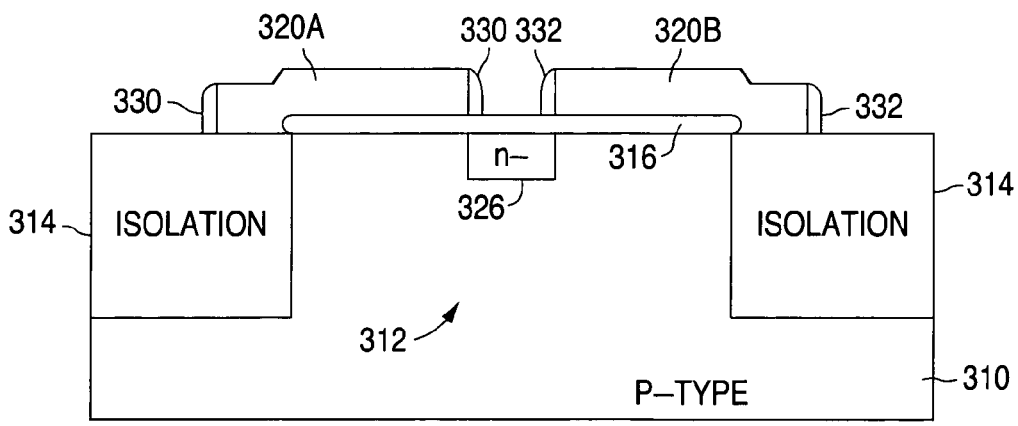

Turning next to FIG. 3C, once gate masks 322A and 322B have been removed, first resistor region 324 of active region 312 is implanted with a dopant to form an n– region 326. Next, a layer of insulation material (not shown) is deposited on isolation region 314, gate oxide layer 316, and polysilicon structures 320A and 320B.

The layer of insulation material is then anisotropically etched until the layer of insulation material has been removed from the top surface of polysilicon structures 320A and 320B to form a side wall spacer 330 that contacts the side wall of polysilicon structure 320A, and a side wall spacer 332 that contacts the side wall of polysilicon structure 320B. Side wall spacers 330 and 332 define a second resistor region on the surface of active region 312 that lies between spacers 330 and 332 within first resistor region 324.

Figure 3D:
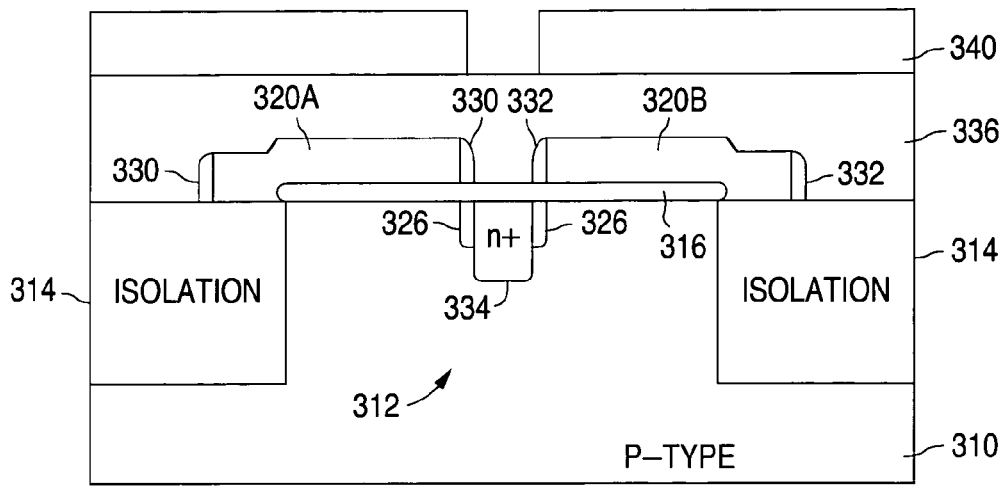

As shown in FIG. 3D, after side wall spacers 330 and 332 have been formed, the second resistor region of active region 312 is implanted with a dopant to form an n+ region 334. Following this, a layer of insulation material 336 is formed and planarized on isolation region 314, gate oxide layer 316, polysilicon structures 320A and 320B, and side wall spacers 330 and 332. Next, a salacide exclusion mask 340 is formed and patterned on insulation layer 336.

Figure 5:
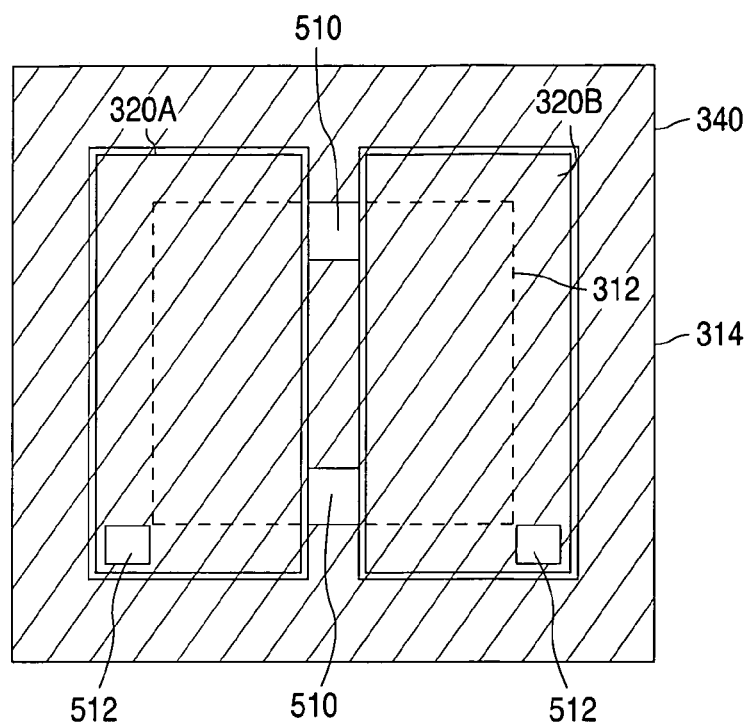
FIG. 5 is a plan view illustrating an example of a semiconductor device that results following the formation of salacide exclusion mask 340 in accordance with the present invention.

FIG. 5 shows a plan view that illustrates an example of a semiconductor device that results following the formation of salacide exclusion mask 340 in accordance with the present invention. As shown in FIG. 5, mask 340 includes a pair of contact-sized openings 510 that overlie first and second opposite ends length-wise of n+ region 334, and a pair of contact-sized openings 512 that overlie surface regions of polysilicon structures 320A and 320B.

Figure 3E:
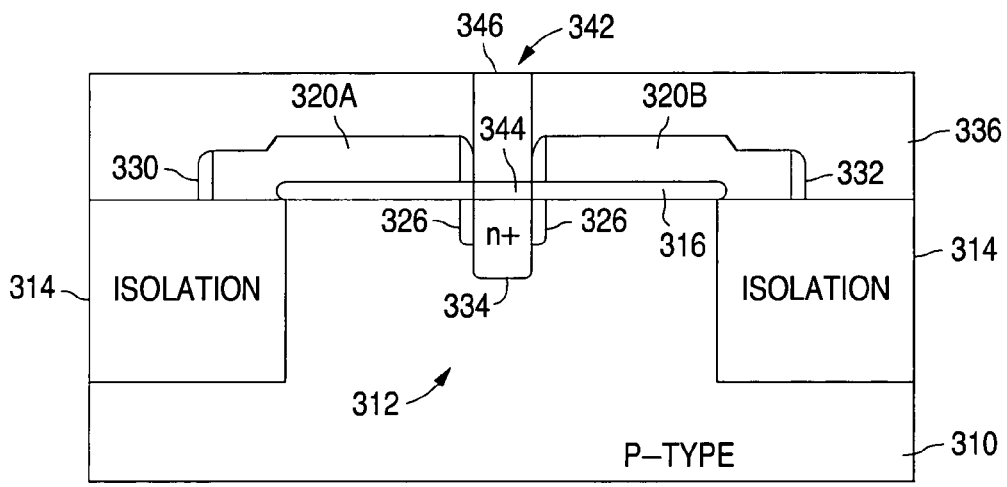

Following this, as shown in FIG. 3E, the exposed regions of insulation layer 336 and the underlying layer of gate oxide layer 116 are etched until n+ region 334 has been exposed to form openings 342 at opposite ends of n+ region 334, and on the surface regions of polysilicon structures 320A and 320B. Mask 340 is removed following the etch.

Once mask 340 has been removed, a layer of metal silicide is deposited, and then reacted to form a layer of metal salacide 344 on opposite ends of n+ region 334, and the surface regions of polysilicon structures 320A and 320B. Next, a layer of contact material is formed on insulation layer 336 and metal salacide region 344 to fill up the openings 342, and then planarized to remove the contact material from the top surface of insulation layer 336 and form metal contacts 346. Contacts 346, which are similar to contacts 140A and 140B, and contacts 142A and 142B, make electrical connections with metal salacide layers 344. After contacts 346 have been formed, the method continues with conventional steps.

Figure 6:
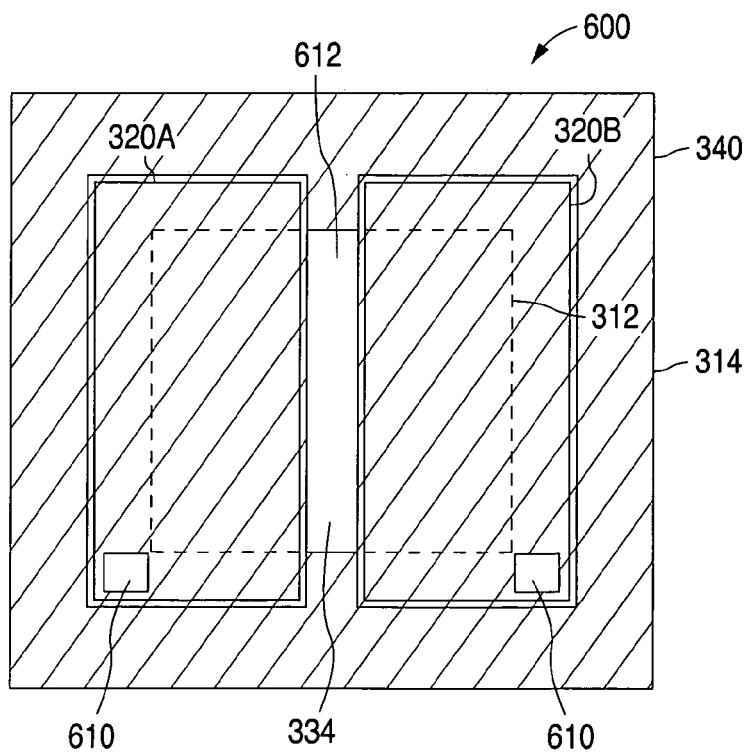
FIG. 6 is a plan view illustrating an example of a method 600 of forming a resistor in accordance with an alternate embodiment of the present invention.

FIG. 6 shows a plan view that illustrates an example of a method 600 of forming a resistor in accordance with an alternate embodiment of the present invention. Method 600 is the same as method 300 except that, as shown in FIG. 6, salacide exclusion mask 340 includes a pair of contact-sized openings 610 that overlies surface regions of polysilicon structures 320A and 320B, and a long narrow opening 612 that overlies the surface of n+ region 334. Thus, when the layer of metal silicide is deposited and reacted, the entire surface of n+ region 334 is covered with a layer of metal salacide.

In addition to improving the accuracy of the width measurement, another advantage of the present invention is that resistors 100 and 200 can be formed at the same time that MOS transistors on other portions of a die are formed. For example, oxide layer 316 can be formed at the same time that a layer of gate oxide layer is formed on other portions of the die, while polysilicon layer 320 can be formed at the same time that a layer of polysilicon is deposited on other parts of the die.

In addition, gate masks 322A and 322B can be formed at the same time that the MOS transistor gate masks are formed, while polysilicon layer 320 can be etched at the same time that the polysilicon layer is etched to form the gates of the transistors that are located on other parts of the die.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor resistor formed in a semiconductor material of a first conductivity type, the resistor comprising:
    a continuous doped region of a second conductivity type formed in the semiconductor material, the doped region having a first region and a spaced-apart second region, different potentials being placed on the first and second regions of the continuous doped region to cause a current to flow between the first region and the second region, the doped region having a length and a width, the doped region including a third region of a first dopant concentration, a fourth region of a second dopant concentration, and a fifth region of a third dopant concentration, the first dopant concentration being substantially larger than the second and third dopant concentrations, the fourth and fifth regions lying on opposite sides of and contacting the third region;
    a layer of insulation that contacts the semiconductor material;
    a first semiconductor structure that contacts the layer of insulation; and
    a second semiconductor structure that contacts the layer of insulation, a spacing between the first and second semiconductor structures being substantially equal to a dimension of the doped region.

2. The semiconductor resistor of claim 1 and further comprising a non-conductive region lying between the first and second semiconductor structures, and over the doped region.

3. The semiconductor resistor of claim 2 and further comprising a contact structure extending through the non-conductive region that makes an electrical connection to the first region of the doped region.

4. The semiconductor resistor of claim 3 wherein the contact structure includes a resistance-lowering layer, and a contact that is connected to the resistance-lowering layer.

5. The semiconductor resistor of claim 4 wherein the resistance-lowering layer contacts the first region of the doped region and extends continuously to the second region of the doped region.

6. The semiconductor resistor of claim 5 wherein the resistance-lowering layer includes a layer of salacide.

7. The semiconductor resistor of claim 1 wherein the first and second semiconductor structures are spaced apart from each other.

8. The semiconductor resistor of claim 7 wherein the first semiconductor structure includes polysilicon.

9. The semiconductor resistor of claim 1 wherein the first and second semiconductor structures contact each other.

10. The semiconductor resistor of claim 9 wherein the first semiconductor structure includes polysilicon.

11. The semiconductor resistor of claim 1 and further comprising an isolation region formed in the semiconductor material to surround an active region and isolate the active region from laterally adjacent regions, the doped region being formed in the active region and contacting the isolation region.

12. The semiconductor resistor of claim 11 wherein the first and second semiconductor structures contact the isolation region.

13. The semiconductor resistor of claim 11 and further comprising:
    a non-conductive region lying over the first and second semiconductor structures; and
    a contact structure extending through the non-conductive region to make an electrical connection to the first semiconductor structure.

* * * * *